United States Patent
Carcia et al.

(10) Patent No.: US 8,445,937 B2
(45) Date of Patent: May 21, 2013

(54) BARRIER FILMS FOR PLASTIC SUBSTRATES FABRICATED BY ATOMIC LAYER DEPOSITION

(75) Inventors: Peter Francis Carcia, Wilmington, DE (US); Robert Scott McLean, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 1258 days.

(21) Appl. No.: 12/055,560

(22) Filed: Mar. 26, 2008

(65) Prior Publication Data

US 2008/0182101 A1 Jul. 31, 2008

Related U.S. Application Data

(63) Continuation of application No. 10/846,749, filed on May 14, 2004, now abandoned.

(60) Provisional application No. 60/471,020, filed on May 16, 2003.

(51) Int. Cl.
*H01L 33/00* (2010.01)

(52) U.S. Cl.
USPC .................................. 257/100; 257/E33.059

(58) Field of Classification Search
USPC ..................... 257/98–100, E33.059
See application file for complete search history.

(56) References Cited

U.S. PATENT DOCUMENTS

| | | | |
|---|---|---|---|
| 5,641,984 A | 6/1997 | Aftergut et al. | |
| 5,693,956 A | 12/1997 | Shi et al. | |
| 5,707,880 A | 1/1998 | Aftergut et al. | |
| 5,719,741 A | 2/1998 | Imai et al. | |
| 5,736,207 A * | 4/1998 | Walther et al. | 428/34.7 |
| 5,757,126 A | 5/1998 | Harvey, III et al. | |
| 5,909,081 A | 6/1999 | Eida et al. | |
| 6,198,217 B1 * | 3/2001 | Suzuki et al. | 313/504 |
| 6,203,613 B1 | 3/2001 | Gates et al. | |
| 6,522,067 B1 * | 2/2003 | Graff et al. | 313/512 |
| 6,605,549 B2 | 8/2003 | Leu et al. | |
| 6,623,861 B2 * | 9/2003 | Martin et al. | 428/412 |
| 6,624,568 B2 * | 9/2003 | Silvernail | 313/504 |
| 6,664,186 B1 | 12/2003 | Callegari et al. | |
| 6,897,474 B2 * | 5/2005 | Brown et al. | 257/40 |
| 6,911,667 B2 * | 6/2005 | Pichler et al. | 257/40 |
| 7,015,152 B2 | 3/2006 | Callegari et al. | |
| 7,015,640 B2 * | 3/2006 | Schaepkens et al. | 313/506 |

(Continued)

FOREIGN PATENT DOCUMENTS

| | | |
|---|---|---|
| EP | 0 846 060 | 10/1998 |
| JP | 08222369 A | 8/1996 |

(Continued)

OTHER PUBLICATIONS

Sobrinho ASD, Czeremuszkin G, Latreche M, Wertheimer MR, Defect-permeation correlation for ultrathin transparent barrier coatings on polymers, Journal of Vacuum Science & Technology A, vol. 18, No. 1, 149-157, 2000.*

(Continued)

*Primary Examiner* — Jenny L Wagner
*Assistant Examiner* — Mark Tornow

(57) ABSTRACT

Gas permeation barriers can be deposited on plastic or glass substrates by atomic layer deposition (ALD). The use of the ALD coatings can reduce permeation by many orders of magnitude at thicknesses of tens of nanometers with low concentrations of coating defects. These thin coatings preserve the flexibility and transparency of the plastic substrate. Such articles are useful in container, electrical and electronic applications.

32 Claims, 3 Drawing Sheets

U.S. PATENT DOCUMENTS

| | | | |
|---|---|---|---|
| 7,579,203 | B2 | 8/2009 | Yamazaki et al. |
| 2001/0031379 | A1* | 10/2001 | Tera et al. ............... 428/690 |
| 2001/0050532 | A1* | 12/2001 | Eida et al. ............... 313/504 |
| 2002/0086307 | A1 | 7/2002 | Amin et al. |
| 2002/0093285 | A1* | 7/2002 | Sugimoto et al. ........... 313/506 |
| 2002/0153523 | A1* | 10/2002 | Bernius et al. ............ 257/40 |
| 2003/0030369 | A1* | 2/2003 | Shih et al. ............... 313/504 |
| 2003/0143319 | A1 | 7/2003 | Park et al. |
| 2003/0164497 | A1* | 9/2003 | Carcia et al. ............. 257/40 |
| 2004/0071878 | A1 | 4/2004 | Schuhmacher et al. |
| 2004/0194691 | A1 | 10/2004 | George et al. |
| 2004/0195967 | A1* | 10/2004 | Padiyath et al. ........... 313/512 |
| 2004/0219783 | A1 | 11/2004 | Ahn et al. |
| 2004/0229051 | A1* | 11/2004 | Schaepkens et al. ......... 428/447 |
| 2005/0093108 | A1 | 5/2005 | Chang |
| 2005/0172897 | A1 | 8/2005 | Jansen |
| 2005/0186342 | A1 | 8/2005 | Sager et al. |
| 2006/0234852 | A1 | 10/2006 | Kim et al. |

FOREIGN PATENT DOCUMENTS

| | | | |
|---|---|---|---|
| JP | 200215861 A | | 1/2002 |
| JP | 2002018994 A | | 1/2002 |
| JP | 2002134272 A | | 5/2002 |
| JP | 2002273811 A | | 9/2002 |
| JP | 2003051386 A | | 2/2003 |
| JP | 2003125315 A | | 4/2003 |
| JP | 2004288456 A | | 10/2004 |
| JP | 2007090803 A | | 4/2007 |
| KR | 1999011464 A | | 2/1999 |
| WO | WO 97/15070 | | 4/1997 |
| WO | WO 99/02277 | | 1/1999 |
| WO | WO 00/08899 | | 2/2000 |
| WO | WO 01/67504 | | 9/2001 |
| WO | WO 01/082390 | | 11/2001 |
| WO | WO 01/89006 | | 11/2001 |
| WO | WO 02/071506 | | 9/2002 |
| WO | 03008110 A1 | | 1/2003 |

OTHER PUBLICATIONS

M.D. Groner, J.W. Elam, F.H. Fabreguette, S.M. George, Electrical characterization of thin Al2O3 films grown by atomic layer deposition on silicon and various metal substrates, Thin Solid Films, vol. 413, Issues 1-2, Jun. 24, 2002, pp. 186-197.*

Carcia, P. F. et al., Ca test of Al2O3 gas diffusion barriers grown by atomic layer deposition on polymers, Applied Physics Letters, 2006, pp. 031915-1-031915-3, vol. 89, American Institute of Physics.

Carcia, P. F. et al., Oxide semiconductors for flexible electronics, Proceedings—Electrochemical Society, (2005), 2004-15 (Thin Film Transistor Technologies (TFTT VII)), pp. 178-188, (Abstract attached).

Ferguson, J. D. et al., Atomic Layer Deposition of Al2O3 Films on Polyethylene Particles, Chem. Mater., 2004, pp. 5602-5609, vol. 16, American Chemical Society.

Groner, M. D. et al., Gas diffusion barriers on polymers using Al2O3 atomic layer deposition, Applied Physics Letters, 2006, pp. 051907-1-051907-3, vol. 88, American Institute of Physics.

Langereis, E. et al., Plasma-assisted atomic layer deposition of Al2O3 moisture permeation barriers on polymers, Applied Physics Letters, 2006, pp. 081915-1-081915-3, vol. 89, American Institute of Physics.

Ras, Robin H. A. et al., Hollow Inorganic Nanospheres and Nanotubes with Tunable Wall Thicknesses by Atomic Layer Deposition on Self-Assembled Polymeric Templates, Advanced Materials, 2007, pp. 102-106, vol. 19, Wiley-VCH Verlag GMbH & Co.

M, Izu et. al., Roll to Roll Microwave PECVD Machine for High-Barrier Film Coatings, J. Photopolymer Science and Technology, 1995, pp. 195-204, vol. 8.

Tuomo Suntola, Atomic Layer Epitaxy, Thin Soild Films, 1992, p. 84-89, vol. 216.

Christopher Hall, Polymer Materials, 1989, Wiley, New York (Book Not Supplied).

J. Comyn, Polymer Permeability, 1985, Elsevier, London (Book Not Supplied).

M. Leskela et. al., ALD Precursor Chemistry: Evolution and Future Challenges, Journal De Physique IV, 1999, pp. 837-852, vol. 9.

Yelena Tropsha et. al., Activated Rate Theory Treatment of Oxygen and Water Transport Through Silicon Oxide/Poly (Ethylene Terephthalate) Composite Barrier Structures, J. Phys. Chem. B, 1997, pp. 2259-2266, vol. 101.

* cited by examiner

BARRIER FILMS FOR PLASTIC SUBSTRATES FABRICATED BY ATOMIC LAYER DEPOSITION

FIELD OF THE INVENTION

The present invention relates to an article comprising a plastic or glass substrate and an atmospheric gas penetration barrier fabricated by atomic layer deposition. The article may be a component of an electrical or electronic device such as an organic light emitting diode. The article may also be used as a container for applications where gas permeation is important.

TECHNICAL BACKGROUND

Featherby and Dehaven (WO 2001067504) disclose a hermetically coated device. Formation of such a device includes the steps of providing an integrated semiconductor circuit die, applying a first layer comprising an inorganic material which envelopes the circuit die, and applying a second layer enveloping the circuit die.

Aintila (WO 9715070 A2) discloses contact bump formation on metallic contact pad areas on the surface of a substrate comprising using atomic layer epitaxy to form an oxide layer on the substrate which is opened at required points in the subsequent process step.

Aftergut and Ackerman (U.S. Pat. No. 5,641,984) disclose a hermetically packaged radiation imager including a moisture barrier. A dielectric material layer is deposited in an atomic layer expitaxy technique as part of the sealing structure.

Aftergut and Ackerman (U.S. Pat. No. 5,707,880) disclose a hermetically packaged radiation imager including a moisture barrier comprising a dielectric material layer deposited by atomic layer expitaxy.

None of the references disclosed a permeation barrier comprising a polymer or glass substrate.

SUMMARY OF THE INVENTION

This invention describes an article comprising:
a) a substrate made of a material selected from the group consisting of plastic and glass, and
b) a film deposited upon said substrate by atomic layer deposition.

The present invention is further an article comprising:
a) A substrate made of a material selected from the group consisting of plastic and glass;
b) an adhesion layer coated; and
c) a gas permeation barrier deposited by atomic layer deposition.

Another embodiment of the present invention is an article comprising:
a) a substrate made of a material selected from the group consisting of plastic and glass;
b) an organic semiconductor, and
c) a gas permeation barrier deposited by atomic layer deposition.

A yet further embodiment of the present invention is an article comprising:
a) A substrate made of a material selected from the group consisting of plastic and glass,
b) A liquid crystal polymer, and
c) a gas permeation barrier deposited by atomic layer deposition The invention further describes an embodiment that is an enclosed container.

Another embodiment of the present invention is an electrical or electronic device.

Yet another embodiment of the present invention is a light-emitting polymer device.

Yet another embodiment of the present invention is liquid crystalline polymer device.

The invention further describes an organic light emitting diode.

Another embodiment of the present invention is a transistor.

Yet another embodiment of the present invention is a circuit comprising a light emitting polymer device.

A still further article is an organic photovoltaic cell.

A second article taught herein comprises a plurality of layers, each layer comprising one article, as described above, wherein the articles are in contact with each other. In one embodiment of this second article of the articles above are in contact with each other by lamination means.

DETAILED DESCRIPTION

Figure 1:
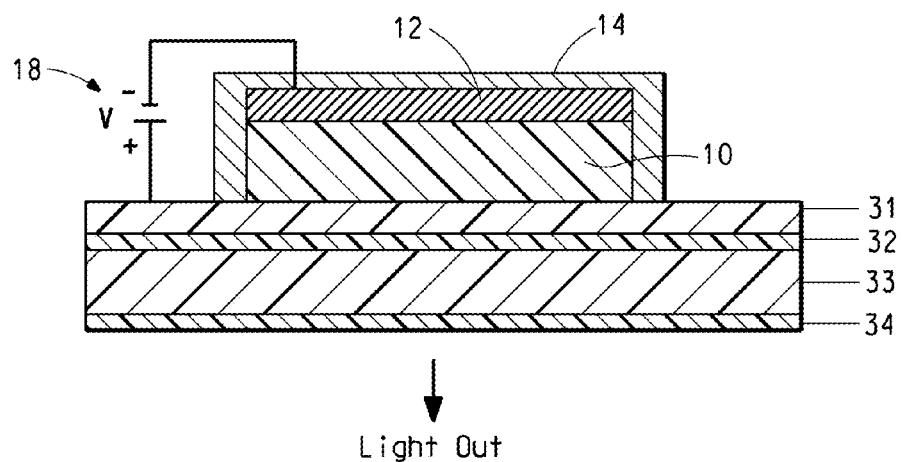
FIG. 1 shows a light-emitting polymer device with a barrier substrate and a barrier top coat.

The permeation of $O_2$ and $H_2O$ vapor through polymer films is facile. To reduce permeability for packaging applications, polymers are coated with a thin inorganic film. Al-coated polyester is common. Optically transparent barriers, predominantly SiOx or $AlO_y$, made either by physical vapor deposition (PVD) or chemical vapor deposition (CVD), are also used in packaging. The latter films are commercially available and are known in the industry as "glass-coated" barrier films. They provide an improvement for atmospheric gas permeation of about 10×, reducing transmission rates to about 1.0 cc $O_2/m^2$/day and 1.0 ml $H_2O/m^2$/day through polyester film (M. Izu, B. Dotter, and S. R. Ovshinsky, J. *Photopolymer Science and Technology.*, vol. 8 1995 pp 195-204). While this modest improvement is a reasonable compromise between performance and cost for many high-volume packaging applications, this performance falls far short of packaging requirements in electronics. Electronic packaging usually requires at least an order of magnitude longer desired lifetime than, for example, beverage containing. As an example, flexible displays based on organic light emitting polymers (OLEDs), fabricated on flexible polyester substrates need an estimated barrier improvement of $10^5$-$10^6$× for exclusion of atmospheric gases since gases can seriously degrade both the light-emitting polymer and the water-sensitive metal cathode which can frequently be Ca or Ba.

Because of their inherent free volume fraction, the intrinsic permeability of polymers is, in general, too high by a factor $10^4$-$10^6$ to achieve the level of protection needed in electronic applications, such as flexible OLED displays. Only inorganic materials, with essentially zero permeability, can provide adequate barrier protection. Ideally, a defect-free, continuous thin-film coating of an inorganic should be impermeable to atmospheric gases. However, the practical reality is that thin films have defects, such as pinholes, either from the coating process or from substrate imperfections which compromise barrier properties. Even grain boundaries in films can present a pathway for facile permeation. For the best barrier properties, films should be deposited in a clean environment on clean, defect-free substrates. The film structure should be amorphous. The deposition process should be non-directional, (i.e. CVD is preferred over PVD) and the growth mechanism to achieve a featureless microstructure would ideally be layer-by-layer to avoid columnar growth with granular microstructure.

Atomic layer deposition (ALD) is a film growth method that satisfies many of these criteria for low permeation. A description of the atomic layer deposition process can be found in "Atomic Layer Epitaxy," by Tuomo Suntola in Thin Solid Films, vol. 216 (1992) pp. 84-89. As its name implies, films grown by ALD form by a layer by layer process. In general, a vapor of film precursor is absorbed on a substrate in a vacuum chamber. The vapor is then pumped from the chamber, leaving a thin layer of absorbed precursor, usually essentially a monolayer, on the substrate. A reactant is then introduced into the chamber under thermal conditions, which promote reaction with the absorbed precursor to form a layer of the desired material. The reaction products are pumped from the chamber. Subsequent layers of material can be formed by again exposing the substrate to the precursor vapor and repeating the deposition process. ALD is in contrast to growth by common CVD and PVD methods where growth is initiated and proceeds at finite numbers of nucleation sites on the substrate surface. The latter technique can lead to a columnar microstructures with boundaries between columns along which gas permeation can be facile. ALD can produce very thin films with extremely low gas permeability, making such films attractive as barrier layers for packaging sensitive electronic devices and components built on plastic substrates.

This invention describes barrier layers formed by ALD on plastic substrates and useful for preventing the passage of atmospheric gases. The substrates of this invention include the general class of polymeric materials, such as described by but not limited to those in *Polymer Materials*, (Wiley, New York, 1989) by Christopher Hall or *Polymer Permeability*, (Elsevier, London, 1985) by J. Comyn. Common examples include polyethylene terephthalate (PET) and polyethylene naphthalate (PEN), which are commercially available as film base by the roll. The materials formed by ALD, suitable for barriers, include oxides and nitrides of Groups IVB, VB, VIB, IIIA, and IVA of the Periodic Table and combinations thereof. Of particular interest in this group are $SiO_2$, $Al_2O_3$, and $Si_3N_4$. One advantage of the oxides in this group is optical transparency which is attractive for electronic displays and photovoltaic cells where visible light must either exit or enter the device. The nitrides of Si and Al are also transparent in the visible spectrum.

The precursors used in the ALD process to form these barrier materials can be selected from precursors known to those skilled in the art and tabulated in published references such as M. Leskela and M. Ritala, "ALD precursor chemistry: Evolution and future challenges," in *Journal de Physique IV*, vol. 9, pp 837-852 (1999) and references therein.

The preferred range of substrate temperature for synthesizing these barrier coatings by ALD is 50° C.-250° C. Too high temperature (>250° C.) is incompatible with processing of temperature-sensitive plastic substrates, either because of chemical degradation of the plastic substrate or disruption of the ALD coating because of large dimensional changes of the substrate.

The preferred thickness range for barrier films is 2 nm-100 nm. A more preferred range is 2-50 nm. Thinner layers will be more tolerant to flexing without causing the film to crack. This is extremely important for polymer substrates where flexibility is a desired property. Film cracking will compromise barrier properties. Thin barrier films also increase transparency in the cases of electronic devices where input or output of light is important. There may be a minimum thickness corresponding to continuous film coverage, for which all of the imperfections of the substrate are covered by the barrier film. For a nearly defect-free substrate, the threshold thickness for good barrier properties was estimated to be at least 2 nm, but may be as thick as 10 nm.

Some oxide and nitride barrier layers coated by ALD may require a "starting" or "adhesion layer" to promote adhesion to the plastic substrate or the article requiring protection. The preferred thickness of the adhesion layer is in the range of 1 nm-100 nm. The choice of the materials for the adhesion layer will be from the same group of barrier materials. Aluminum oxide and silicon oxide are preferred for the adhesion layer, which may also be deposited by ALD, although other methods such as chemical and physical vapor deposition or other deposition methods known in the art may also be suitable.

The basic building block of the barrier structure is either: (A) a single barrier layer with or without an adhesion layer, coated by ALD on a plastic or glass substrate, or (B) a barrier layer with or without an adhesion layer, coated by ALD on each side of a plastic substrate. This basic structure can then be combined in any number of combinations by laminating this building block to itself to form multiple, independent barrier layers. It is known in the art of barrier coatings that multiple layers, physically separate, can improve the overall barrier properties by much more than a simple multiplicative factor, corresponding the number of layers. This is demonstrated, for example, in *J. Phys. Chem. B* 1997, vol. 101, pp 2259-2266, "Activated rate theory treatment of oxygen and water transport through silicon oxide/poly(ethylene terephthalate) composite barrier structures," by Y. G. Tropsha and N. G. Harvey. This follows because the path for diffusing gas molecules is tortuous through multiple barrier layers that are separated. The effective diffusion path is much larger than the sum of the thickness of the individual layers.

Another barrier configuration involves directly coating the electronic or electro-optical device, requiring protection. In this regard, ALD is particularly attractive because it forms a highly conformal coating. Therefore devices with complex topographies can be fully coated and protected.

EXAMPLES

Example 1

FIG. 1 shows a schematic representation of a light-emitting polymer device. For simplicity, the light emitting polymer device is shown as the light-emitting polymer (LEP) sandwiched between two electrodes. In practice, a hole-conducting and/or electron-conducting layer can be inserted between the appropriate electrode and the LEP layer to increase device efficiency. The anode 31 is a layer of indium-tin oxide and the cathode 12 is a Ca/Al layer composite. With a voltage 18 applied between the electrodes, holes injected at the anode and electrons injected at the cathode combine to form excitons which decay radioactively, emitting light from the LEP 10. The LEP is typically a photosensitive polymer such as poly-phenylene vinylene (PPV) or its derivatives. The cathode is frequently Ba or Ca and is extremely reactive with atmospheric gases, especially water vapor. Because of the use of these sensitive materials, the device packaging needs to exclude atmospheric gases in order to achieve reasonable device lifetimes. In FIG. 1, the package is comprised of a barrier-substrate 32, 33, 34 which can be plastic or glass on which the LEP device is deposited and then a top coated barrier film 14. The substrate 33 is comprised of a polyester film, polyethylene naphthalate (PEN) which is 0.004 inch thick. Each side of the PEN film is coated with a 50 nm thick film of $Al_2O_3$ $_{32,33}$, which is deposited by atomic layer deposition, using trimethylaluminum as the precursor for aluminum and ozone ($O_3$) as the oxidant. The substrate temperature during deposition is 150° C. In the ALD process, the PEN substrate is placed in a vacuum chamber equipped with a mechanical pump. The chamber is evacuated. The trimethylaluminum precursor is admitted to the chamber at a pressure of 500 millitorr for approximately 2 seconds. The chamber is then purged with argon for approximately 2 seconds. The oxidant, ozone, is then admitted to the chamber at approximately 500 millitorr for approximately 2 seconds. Finally, the oxidant is purged with argon for approximately 2 seconds. This deposition process is repeated approximately 50 times to obtain a coating approximately 100 nanometers in thickness. The $Al_2O_3$ layer is optically transparent in the visible.

The coated substrate may be flexed without loss of the coating. One of the $Al_2O_3$ barriers is coated with indium-tin oxide 31 transparent conductor by rf magnetron sputtering from a 10% (by weight) Sn-doped indium oxide target. The ITO film thickness is 150 nm. The LEP is spin coated on the ITO electrode, after which a cathode 12 of 5 nm Ca with about 1μm of Al are thermally evaporated from Ca and Al metal sources, respectively. This LEP device is then coated with a 50 nm-thick, top barrier layer film of $Al_2O_3$ $_{14}$, deposited by atomic layer deposition, again using trimethylaluminum as the precursor for aluminum and ozone ($O_3$) as the oxidant. The resulting structure is now impervious to atmospheric gases.

Example 2

Figure 2:
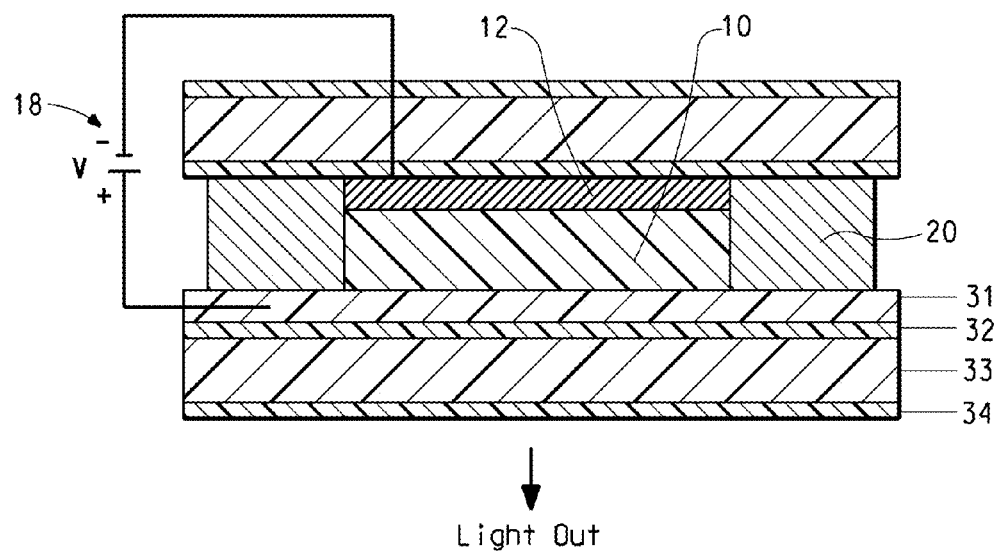
FIG. 2 shows a light-emitting polymer device with a barrier substrate and a barrier capping layer.

Another version of a packaging scheme is shown in FIG. 2. The top-coated barrier is replaced by an identical substrate barrier structure ($Al_2O_3$/PEN/$Al_2O_3$) without an ITO electrode as described in the Example 1 above. This capping barrier structure is sealed to the substrate barrier using a layer 20 of epoxy.

Example 3

Figure 3:
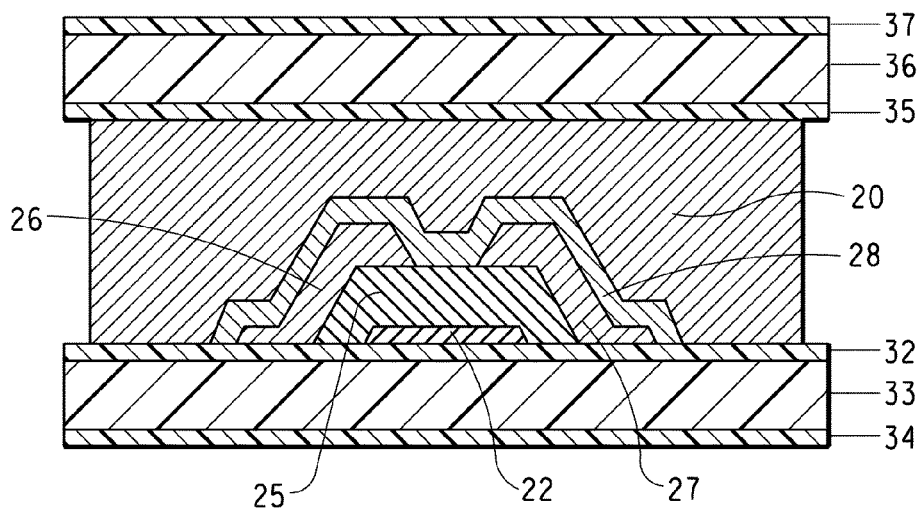
FIG. 3 shows an organic transistor with a barrier substrate and a barrier capping layer.

FIG. 3 illustrates a protection strategy with ALD barrier coatings for an organic transistor. The transistor shown is a bottom gate structure with the organic semiconductor 28 as the final or top layer. Because most organic semiconductors are air sensitive and prolonged exposure degrades their properties, protection strategies are necessary. In FIG. 3 the package is comprised of a barrier-substrate 32, 33, 34 on which the transistor is deposited and then sealed to an identical capping barrier structure 35, 36, 37. The substrate 36 is comprised of a polyester film, polyethylene naphthalate (PEN), 0.004 inch thick. Each side 35, 37 of the PEN film is coated with a 50 nm thick film of $Al_2O_3$, which is deposited by atomic layer deposition, using trimethylaluminum as the precursor for aluminum and ozone ($O_3$) as the oxidant. The substrate temperature during deposition is 150° C. In the ALD process, the PEN substrate 36 is placed in a vacuum chamber equipped with a mechanical pump. The chamber is evacuated. The trimethylaluminum precursor is admitted to the chamber at a pressure of 500 millitorr for approximately 2 seconds. The chamber is then purged with argon for approximately 2 seconds. The oxidant, ozone, is then admitted to the chamber at approximately 500 millitorr for approximately 2 seconds. Finally, the oxidant is purged with argon for approximately 2 seconds. This deposition process is repeated approximately 50 times to obtain a coating approximately 100 nanometers in thickness. A gate electrode 22 of 100 nm thick Pd metal is ion-beam sputtered through a shadow mask on to the barrier film 32 of $Al_2O_3$. A gate dielectric 25 of 250 nm $Si_3N_4$ is then deposited by plasma-enhanced chemical vapor deposition, also through a mask to allow contact to the metal gate. This is followed by patterning of 100 nm-thick Pd source 26 and drain 27 electrodes, ion beam sputtered on the gate dielectric 25. Finally the top organic semiconductor 28, e.g. pentacene, is thermally evaporated through a shadow mask that allows contact to source-drain electrodes. The entire transistor is capped with an $Al_2O_3$/PEN/$Al_2O_3$ barrier-structure 35, 36, 37, sealed to substrate barrier with an epoxy sealant 20.

Example 4

Figure 4:
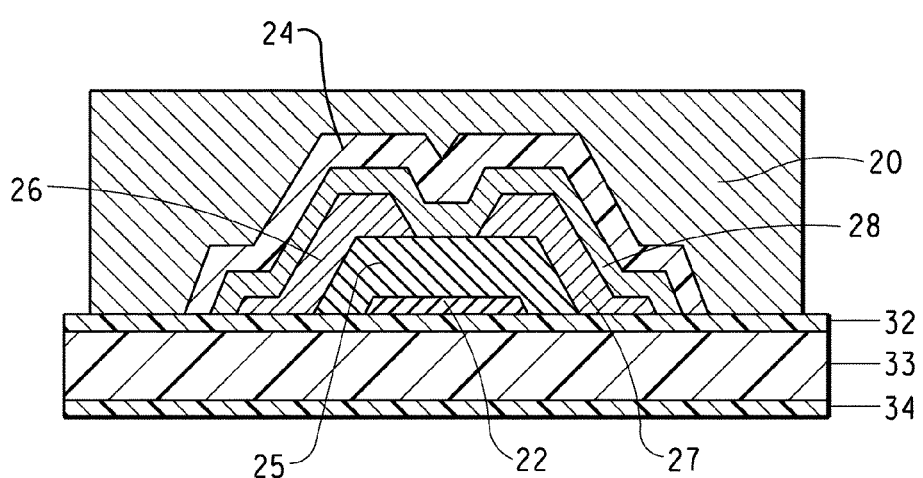
FIG. 4 shows an organic transistor with a barrier substrate and a barrier capping layer.

In FIG. 4, the capping barrier of Example 3 can be replaced by a single layer 24 of 50 nm-thick $Al_2O_3$, deposited by atomic layer deposition, using trimethylaluminum as the precursor for aluminum and ozone ($O_3$) as the oxidant. Both packaging structures for the organic transistor device are impervious to atmospheric gases. The plastic substrate with barrier coatings can also be replaced by an impermeable glass substrate.

The barrier capping layer is comprised of an initial adhesion layer of silicon nitride deposited by plasma-enhanced chemical vapor deposition at room temperature, followed by a 50 nm-thick Al2O3 24 barrier, deposited by atomic layer deposition, as described in Example 3.

Example 5

Figure 5:
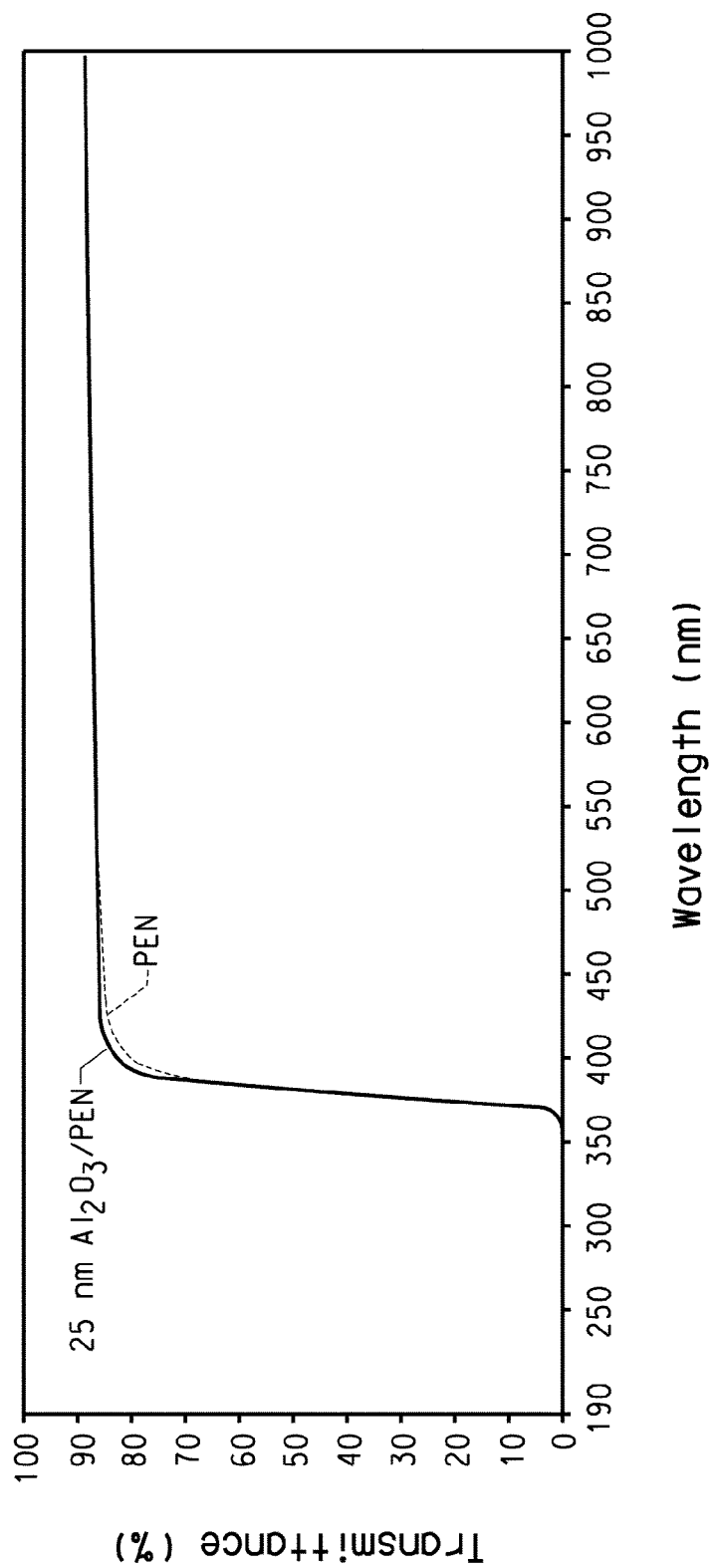
FIG. 5 shows the measured optical transmission through 0.002 inch thick polyethylene naphthalate (PEN) coated with 25 nm of $Al_2O_3$ barrier film.

A substrate film of polyethylene terephthalate (PEN), 0.002 inches thick, was coated by atomic layer deposition at 120° C. with $Al_2O_3$ about 25 nm thick on one side of the PEN substrate. Prior to evaluating its permeability properties the coated PEN substrate was flexed at least once to a radius of at least 1.5 inches to remove the coated $Al_2O_3$-coated PEN substrate from the rigid silicon carrier wafer, to which it was attached with Kapton® tape during ALD deposition. The oxygen transport rate with 50% relative humidity was measured with a commercial instrument (MOCON Ox-Tran 2/20) through the film with $Al_2O_3$ deposited by ALD. After 80 hours of measurement time, within the measurement sensitivity (0.005 cc-$O_2$/$m^2$/day), no oxygen transport (<0.005 cc/$m^2$/day) through the barrier film was detected, in spite of the severe prior flexing. For comparison, we measured oxygen transport of about 10 cc-$O_2$/m2/day through an uncoated PEN substrate. FIG. 5 shows that the optical transmission for this $Al_2O_3$-coated PEN barrier and uncoated PEN is the same (>80% transmittance above 400 nm) verifying the transparency of the thin $Al_2O_3$ barrier coating.

What is claimed is:
1. An article comprising,
   a) an electronic device; and
   b) a first barrier structure comprising a flexible plastic substrate film and a barrier coating deposited on at least one side of the flexible plastic substrate film, the barrier coating comprising at least one 2-100 nanometer thick layer amorphous $Al_2O_3$ and the barrier coating having an amorphous and featureless microstructure and having an oxygen gas transport rate below 0.005 $cm^3/m^2$ day.

2. The article of claim 1 further comprising at least one adhesion layer disposed between the flexible plastic substrate film and the barrier coating.

3. The article of claim 2 wherein the adhesion layer is 1 to 100 nm thick.

4. The article of claim 2 wherein the adhesion layer is deposited by a method selected from the group consisting of chemical vapor deposition, physical vapor deposition, and atomic layer deposition.

5. The article of claim 1 wherein the first barrier structure comprises a barrier coating deposited on each surface of the flexible plastic substrate film.

6. The article of claim 1 wherein the electronic device is a transistor, an organic light emitting diode, or a photovoltaic cell.

7. The article of claim 1 wherein the first barrier structure is transparent.

8. The article of claim 1 which further comprises a second barrier structure.

9. The article of claim 8 wherein the electronic device is deposited on the second barrier structure and the first barrier structure caps the electronic device.

10. The article of claim 9 wherein the first barrier structure is further sealed to the second barrier structure.

11. The article of claim 8 wherein the second barrier structure comprises a second flexible plastic substrate film and a second barrier coating deposited on at least one side thereof, the second barrier coating comprising at least one 2-100 nanometer thick layer of amorphous $Al_2O_3$ having an amorphous and featureless microstructure and having an oxygen gas transport rate below 0.005 $cm^3/m^2$ day.

12. The article of claim 9 wherein the second barrier structure has the same structure as the first barrier structure.

13. The article of claim 9 wherein the second barrier structure further comprises at least one adhesion layer disposed between the second flexible plastic substrate film and the second barrier coating.

14. The article of claim 13 wherein the adhesion layer is 1 to 100 nm thick.

15. The article of claim 13 wherein the adhesion layer is deposited by a method selected from the group consisting of chemical vapor deposition, physical vapor deposition, and atomic layer deposition.

16. The article of claim 9 wherein the second barrier structure comprises a barrier coating disposed on each surface of the second flexible plastic substrate film.

17. The article of claim 9 wherein the first barrier structure is disposed upon the barrier coating of the second barrier structure.

18. The article of claim 1 wherein the barrier coating is disposed on the flexible plastic substrate film by a process comprising:
   a) providing the flexible plastic substrate film held at a temperature from 50° C. to 250° C.;
   b) absorbing a vapor of a precursor material onto the flexible plastic substrate film in a chamber to form an absorbed precursor;
   c) pumping the vapor from the chamber, wherein the absorbed precursor material forms a thin film on the flexible plastic substrate film;
   d) introducing a reactant into the chamber, wherein the reactant reacts with the absorbed precursor material to form the barrier coating on the flexible plastic substrate film.

19. The article of claims 1 wherein the barrier coating is disposed on the flexible plastic substrate film by atomic layer deposition.

20. The article of claim 11 wherein the barrier coating is disposed on the second flexible plastic substrate film by a process comprising:
   a) providing the second flexible plastic substrate film held at a temperature from 50° C. to 250° C.;
   b) absorbing a vapor of a precursor material onto the second flexible plastic substrate film in a chamber to form an absorbed precursor;
   c) pumping the vapor from the chamber, wherein the absorbed precursor material forms a thin film on the flexible plastic substrate film;
   d) introducing a reactant into the chamber, wherein the reactant reacts with the absorbed precursor material to form the second barrier coating on the second flexible plastic substrate film.

21. The article of claim 18 or 20 wherein the chamber is a vacuum chamber.

22. The article of claim 9 wherein the electronic device is disposed between the first barrier structure and the second barrier structure.

23. The article of claim 1 wherein the first barrier structure is laminated to other first barrier structures forming multiple independent barrier structure layers.

24. The article of claim 11 wherein the second barrier structure is laminated to other second barrier structures forming multiple independent barrier structure layers.

25. A barrier structure comprising at least one flexible plastic substrate film and a barrier coating deposited on at least one surface of the flexible plastic substrate film, the barrier coating comprising at least one 2-100 nanometer thick layer of amorphous $Al_2O_3$ the barrier coating having an amorphous and featureless microstructure and having an oxygen gas transport rate below 0.005 $cm^3/m^2$ day.

26. The barrier structure of claim 25, wherein the flexible plastic substrate film is a polyester.

27. The barrier structure of claim 25, wherein the flexible plastic substrate film is PET or PEN.

28. The article of claim 18 or 20 wherein the absorbed precursor material is trimethylaluminum.

29. The article of claim 11 wherein the second barrier coating is disposed on the second flexible plastic substrate film by atomic layer deposition.

30. The article of claim 1, wherein the electronic device is deposited on the first barrier structure and the article further comprises a barrier capping layer deposited onto the electronic device, the barrier capping layer comprising at least one 2-100 nanometer thick layer of amorphous $Al_2O_3$, the barrier capping layer having an amorphous and featureless microstructure and having an oxygen gas transport rate below 0.005 $cm^3/m^2$ day.

31. The article of claim 1, wherein the barrier coating has a thickness of 2 to 50 nm.

32. The article of claim 11, wherein the barrier coating has a thickness of 2 to 50 nm.

* * * * *